: # (12) United States Patent
Painter et al.

(10) Patent No.: US 7,427,908 B1
(45) Date of Patent: Sep. 23, 2008

(54) MAGNETIC SHIMMING CONFIGURATION WITH OPTIMIZED TURN GEOMETRY AND ELECTRICAL CIRCUITRY

(75) Inventors: Thomas Painter, Tallahassee, FL (US); Mark Bird, Tallahassee, FL (US); Scott Bole, Tallahassee, FL (US)

(73) Assignee: Florida State University Research Foundation, Tallahassee, FL (US)

( * ) Notice: Subject to any disclaimer, the term of this patent is extended or adjusted under 35 U.S.C. 154(b) by 0 days.

(21) Appl. No.: 12/004,993

(22) Filed: Dec. 21, 2007

(51) Int. Cl.
*H01F 7/00* (2006.01)
*G01V 3/00* (2006.01)

(52) U.S. Cl. ........................ 335/301; 324/320
(58) Field of Classification Search ................. 335/301; 324/320
See application file for complete search history.

(56) References Cited

U.S. PATENT DOCUMENTS

| | | | | |
|---|---|---|---|---|
| 5,773,976 A | * | 6/1998 | Sakakura et al. | 318/460 |
| 5,818,319 A | * | 10/1998 | Crozier et al. | 335/299 |
| 6,265,960 B1 | * | 7/2001 | Schauwecker et al. | 335/301 |
| 6,977,571 B1 | * | 12/2005 | Hollis et al. | 335/216 |
| 7,148,690 B2 | * | 12/2006 | Hollis | 324/320 |
| 2007/0241755 A1 | * | 10/2007 | Ikedo | 324/320 |
| 2008/0054902 A1 | * | 3/2008 | Juchem | 324/320 |

* cited by examiner

*Primary Examiner*—Ramon M Barrera
(74) *Attorney, Agent, or Firm*—J. Wiley Horton

(57) ABSTRACT

A magnetic shimming configuration for a high-field magnet having optimized turn geometry and electrical circuitry. The present invention accomplishes this by combining the corrective functionalities of the standard X and ZX shims into two single, simplified electrical circuits and conductors, optimized for field strength as a function of turn location. The standard Y and ZY shims were also replaced with two single, simplified circuits and conductor that is corrective of the Y and ZY fields. The new configuration also eliminates the need of additional "second, outboard turns" of the traditional X, ZX, Y, and ZY shims, located further away from the midplane.

20 Claims, 17 Drawing Sheets

Standard Z2 Shim

Standard X Shim

Standard XZ Shim

US 7,427,908 B1

MAGNETIC SHIMMING CONFIGURATION WITH OPTIMIZED TURN GEOMETRY AND ELECTRICAL CIRCUITRY

CROSS-REFERENCES TO RELATED APPLICATIONS

Not Applicable.

STATEMENT REGARDING FEDERALLY SPONSORED RESEARCH OR DEVELOPMENT

Not Applicable

MICROFICHE APPENDIX

Not Applicable

BACKGROUND OF THE INVENTION

1. Field of the Invention

This invention relates to the field of shimming of electromagnets. More specifically, the present invention comprises a new magnetic shimming configuration having optimized turn geometry and electrical circuitry.

2. Description of the Related Art

High-field magnets are widely used for many different applications including fundamental research, magnetic resonance imaging (MRI), nuclear magnetic resonance (NMR) and Fourier-Transform Ion Cyclotron Resonance (FT-ICR). A typical high-field magnet creates a magnetic field that is not completely uniform. That is, if one plotted the strength of the magnetic field in physical space, one would see many peaks and valleys. In many applications, it is desirable to have magnetic field that is more nearly homogenous across a specific region. High-field magnets commonly employ resistive and superconductive shims to shape the magnetic field in order to make the field more uniform. For example, MRI magnet systems employ magnetic shimming to create the field homogeneity required to create detailed images.

The term "shim"—which is well known to those skilled in the art—refers to a magnetic analogy to a physical shim used to level and stabilize a mechanical device. In the context of an electromagnet, a "shim" is a passive or active conductor which alters the magnetic field. As an example, if there is a dip in the field strength in a particular region (and generally in a particular orientation), a shim can be placed to increase the field strength in that region. Likewise, if there is a spike in the field strength in a particular region, a shim can be placed to reduce the field strength in that region.

Shims can be passive or active. A passive is typically just a volume of ferromagnetic material placed in a desired location (such as an iron ring placed around the central bore of an electromagnet). A passive shim does not conduct externally applied electrical current, though it may of course conduct some induced current. An active shim, on the other hand, does conduct externally applied electrical current. This current may be varied in order to vary the corrective magnetic field created by the shim.

The use of both passive and active shims is well known in the art. Because the present invention concerns active shims, the previously existing techniques regarding active shims will be discussed in more detail. FIGS. 1-7 graphically depict commonly used active shims.

The lower view of FIG. 1 shows a conventional coordinate system using x, y, and z axes. The +x, +y, and +z axes are shown and labeled. Those skilled in the art will know that each axis has a negative counterpart extending in the opposite direction. Thus, the −z axis extends downward with respect to the orientation shown in the view. The −x axis extends into the page to the right. The −y axis extends into the page and to the left. The coordinate axes are conventionally used to describe positions and directions. As an example, the +z direction would be upward with respect to the orientation of FIG. 1, while the −z direction would be downward.

Electromagnets typically assume a cylindrical configuration, with the windings wrapping around central axis 34. The z-axis of the coordinate system conventionally lies along central axis 34. Electromagnets are typically symmetric about a mid-plane. The x-axis of the coordinate system is placed on mid-plane 32 (It is obviously also orthogonal to the z-axis). The y-axis is orthogonal to both the z-axis and the x-axis. It also lies on the magnet's mid-plane. The principles involved in the present invention are scalable. Thus, the physical location of each of the shims is expressed in terms of ratios rather than absolute dimensions. The symbol "a" represents the radius of a particular current loop. Thus, the azimuthal plot of FIG. 1 shows the position in terms of the ratio z/a, rather than an absolute dimension. For example, a particular prior art Z Shim has one turn located at a z/a position of +0.8, and one turn located as a z/a position of −0.8. If the radius "a" of the turns is 0.100 m, then the position of the two turns in the z direction would be +0.08 m and −0.08 m.

Large prior art electromagnets are encased in a cooling jacket which forces a cooling liquid through the conductor coils. The jacket has an inner cylindrical wall surrounding the magnet's central bore. It is common to place the shims immediately adjacent to this cylindrical wall. Because the shims must be cooled. they are placed on the same side of the cylindrical wall as the conductor turns. FIG. 1 depicts a standard "Z Shim," which consists of two loops. The lower view graphically depicts the location of these loops with respect to the coordinate system. Both loops have a given radius "a."

The upper view in FIG. 1 is an azimuthal plot depicting the Z Shim's coils location in terms of the ratio z/a (which is the location of the coil conductor along the z-axis divided by the radius "a" of the coil). Those skilled in the art will realize that the depiction of FIG. 1 could apply to a magnet of any size. The 0 degree azimuthal position on the plot refers to the x-axis, while the 270 degree position refers to the y-axis.

The arrows in the upper view of FIG. 1 depict the direction of electrical current flow in the two loops. An external voltage is typically applied to the two loops in order to create the current flow and the desired magnetic effects. The reader will observe that the current flows in opposite directions in the two loops. Referring to the lower view of FIG. 1, the current in the upper loop flows in a clockwise direction, while the current in the lower loop flows in an anticlockwise direction. The magnetic field created by these currents lies along the z-axis, with off-axis components being negligible.

FIG. 2 shows a standard "Z2 Shim." This prior art shim uses four current loops spaced as shown in the view. The current in the top and bottom loops flows in a clockwise direction, while the current in the two middle loops flows in an anticlockwise direction. The magnetic field created lies along the z-axis. Those skilled in the art will know that the field created by the Z2 shim differs significantly from that created by the Z shim. For the Z shim, the field strength varies roughly linearly as one travels from the mid plane through the position of the coils. For the Z2 shim, the field strength varies exponentially. Thus, using both the Z and Z2 shims can be useful in "tuning" the magnetic field.

FIG. 3 shows a standard "X Shim." It employs two pairs of loops, with one lying above the mid plane and one lying below it. Electrical current in the loops flows as shown by the arrows. The reader will observe that the magnetic field created will lie primarily along the x-axis. Because the loops are not completely orthogonal to the x-axis, there will be some off-axis components. However, since the current in the two pair of loops flows in opposite directions, these off-axis components tend to be cancelled out.

FIG. 4 shows a prior art "Y Shim." Like the X Shim, it employs two pair of coils, with one lying above the mid-plane and one lying below it. However, the coils of the Y Shim are rotated 90 degrees about the z-axis with respect to the coils of the X Shim. The current flows as shown by the arrows. The magnetic field created lies primarily along the y-axis, with the off-axis components again being cancelled out.

FIG. 5 shows a prior art "XZ Shim." It also employs two pair of coils located above and below the mid-plane. However the current flow is different than for the X and Y Shims. The current in a given loop lying above the mid-plane is the same as in the corresponding coil lying below the mid-plane (For the X and Y Shims it is opposite). The magnetic components along the y-axis cancel out (or very nearly cancel out), but the components lying along the x-axis and z-axis do not. Hence, this shim is known as an XZ Shim.

FIG. 6 shows a prior art "YZ Shim." It employs the same coil arrangement as the XZ Shim, except that the coils are rotated 90 degrees about the z-axis. This shim produces a magnetic field having y components and z components, but negligible x components.

Practical shimming configurations combine the shims depicted in FIGS. 1-6, as well as others. The conductive paths must be overlaid around the magnet's core. The various loops overlap at certain points, with insulation being laid between them to prevent a short. FIG. 7 is an azimuthal plot showing the loops of FIGS. 1-6 overlaid. While it is very difficult to discern the individual loops in FIG. 7, the reader may readily appreciate that numerous overlaps exist. The horizontal components of the X shim shown in FIG. 3 and the Y shim shown in FIG. 4 overlay each other to form a double thickness for a large distance. Likewise, the horizontal components of the XZ shim shown in FIG. 5 and the YZ shim shown in FIG. 6 overlay each other for a substantial distance. The vertical components of the X shim of FIG. 3 and the XZ shim of FIG. 5 overlay each other for substantial distances. The vertical components of the Y shim of FIG. 4 and the YZ shim of FIG. 6 overlay each other for substantial distances.

These significant overlays create additional thickness in the shim layer. As stated previously, the shims are typically located on the conductor side of the cooling jacket's inner cylindrical wall. Any added thickness in this region moves the innermost conductor further away from the magnet's central axis, with a consequent reduction in field strength. Thus, it is preferable to provide shimming current loops having a reduced thickness. The present invention achieves this objective.

BRIEF SUMMARY OF THE INVENTION

The present invention is a magnetic shimming configuration for a high-field magnet having an improved conductor structure, optimized turn geometry and improved electrical circuitry. The present invention accomplishes this by combining the corrective functionalities of the standard X and ZX shims into two single, simplified electrical circuits and conductors, optimized for field strength as a function of turn location. The standard Y and ZY shims were also replaced with two single, simplified circuits and conductors that are corrective of the Y and ZY fields. The new configuration also eliminates the need of additional "second, outboard turns" of the traditional X, ZX, Y, and ZY shims, located further away from the mid-plane.

The revised configuration has no substantial overlays. The various coils do overlap, but only at perpendicular intersection points. A "nesting" intersection is sued so that the entire shim assembly is only one conductor thick. Thus, the invention minimizes the thickness of the shim layer.

REFERENCE NUMERALS IN THE DRAWINGS

| 10 | resistive magnet | 12 | electrical insulation overwrap |
|---|---|---|---|
| 14 | shim turn | 16 | cross-over turn |
| 18 | shim coil former | 20 | bore tube |
| 22 | SCH axis | 28 | reduced portion |
| 30 | reduced portion | 32 | mid-plane |
| 34 | central axis | 36 | crossing point |

DETAILED DESCRIPTION OF THE INVENTION

Figure 9:
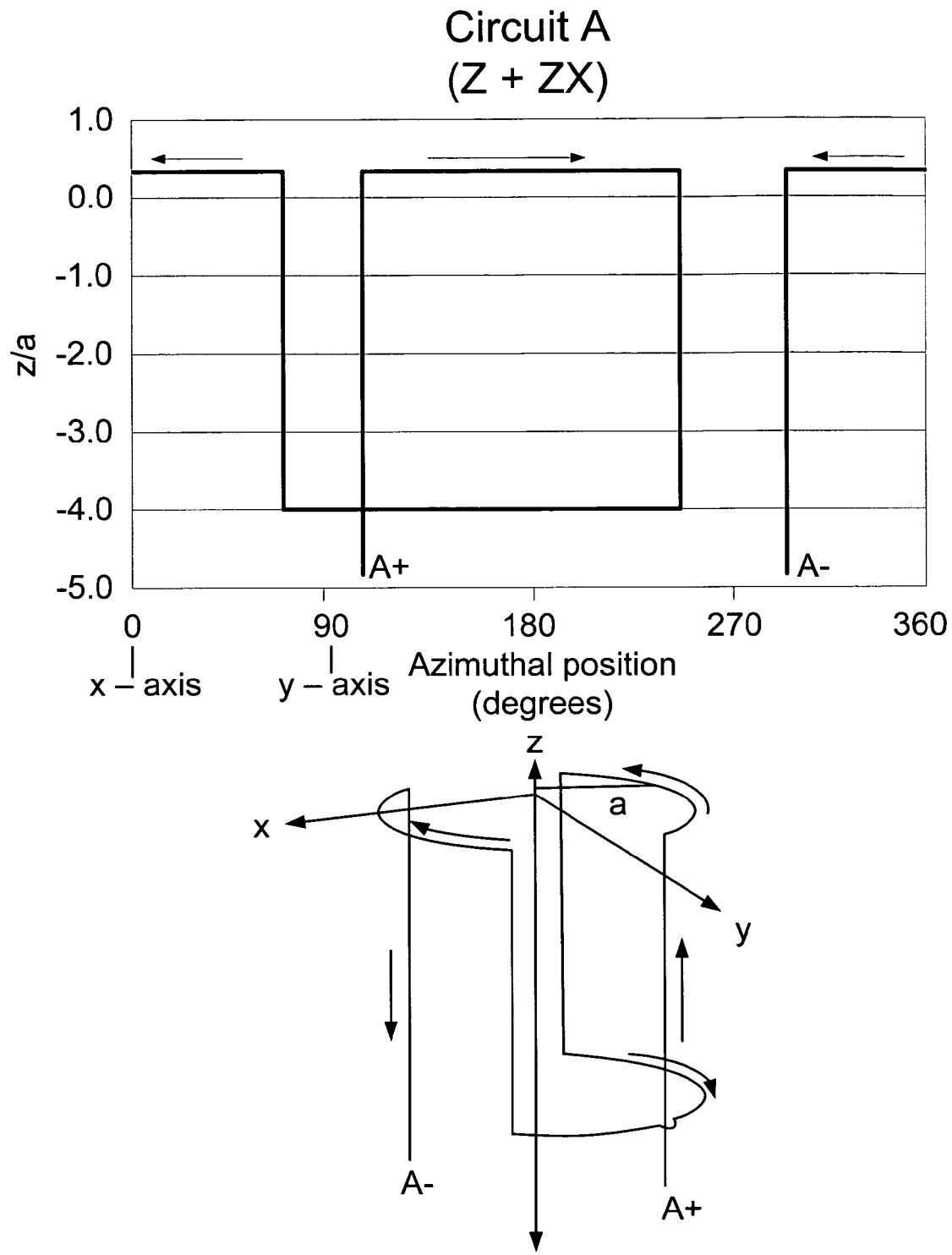
FIG. 9 is a cylindrical coordinate system graph, illustrating the location and configuration of an "X+ZX" shim of the present invention used in place of the prior art.
Figure 10:
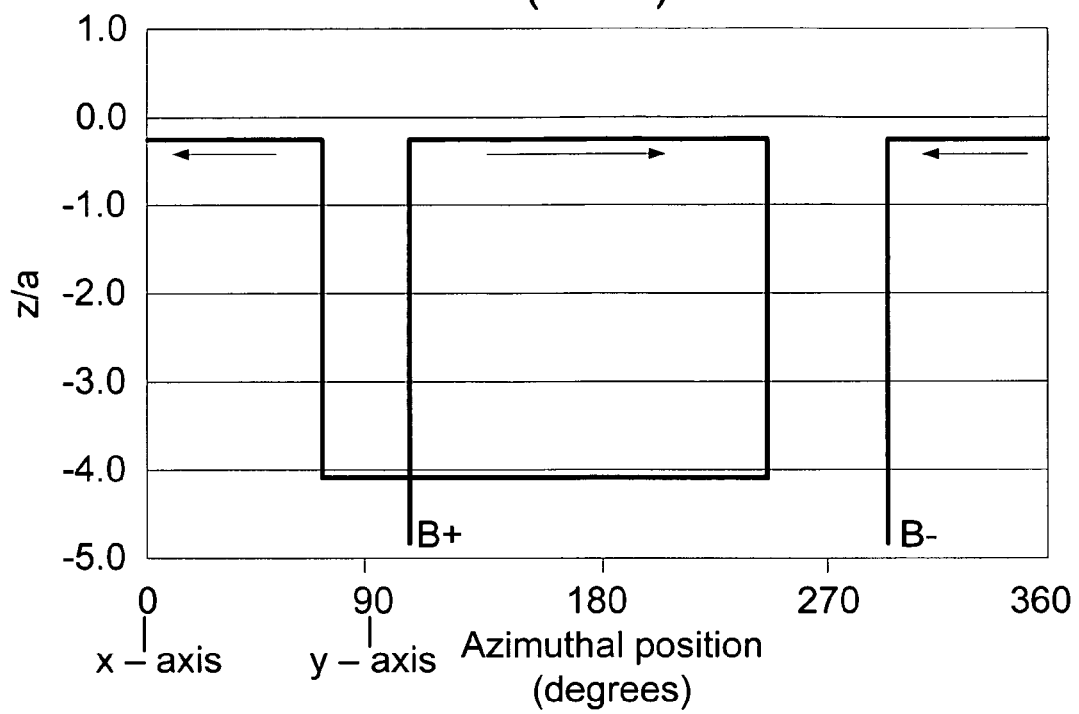
FIG. 10 is a cylindrical coordinate system graph, illustrating the location and configuration of an "X–ZX" shim of the present invention used in place of the prior art.
Figure 10:
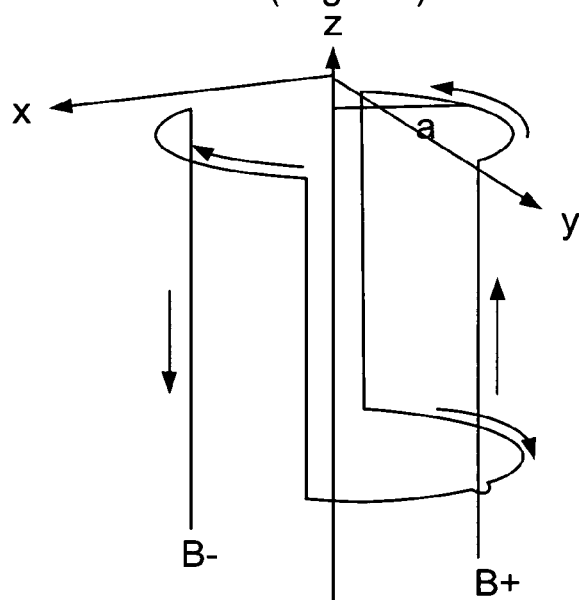

The present invention is a magnetic shimming configuration having optimized turn geometry and electrical circuitry for correcting spatial inhomogeneities of a magnetic field. The proposed shim configuration is illustrated in FIGS. 9-16. Circuits A and B (which replace the prior art X and ZX shim configurations) are illustrated in FIGS. 9 and 10, respectively. FIG. 9 shows Circuit A, which is an "X+ZX" shim.

The arrows shown in FIG. 9 depict the direction of current flow (true of all the drawing figures). The reader will observe that Circuit A includes one complete loop surrounding the −x axis. The azimuthal plot shows this complete loop, which is centered on the 180 degree position. When viewed on the azimuthal plot, current in this loop flows in a clockwise direction. Circuit A replaces the inboard, above-midplane turns of the X and ZX shims of the prior art.

FIG. 10 shows Circuit B. It follows the same path as Circuit A, except that it is translated in the −z direction. It contains one complete loop which also surrounds the −x axis. When viewed on the azimuthal plot, the electrical current within this complete loop flows in a clockwise direction. Circuit B replaces the inboard, below-midplane turns of the X and ZX shims of the prior art. The inlet lines for Circuits A and B (A+ and B+) and the corresponding outlet lines (A− and B−) are slightly offset with respect to each other so that they do not overlay.

Figure 11:
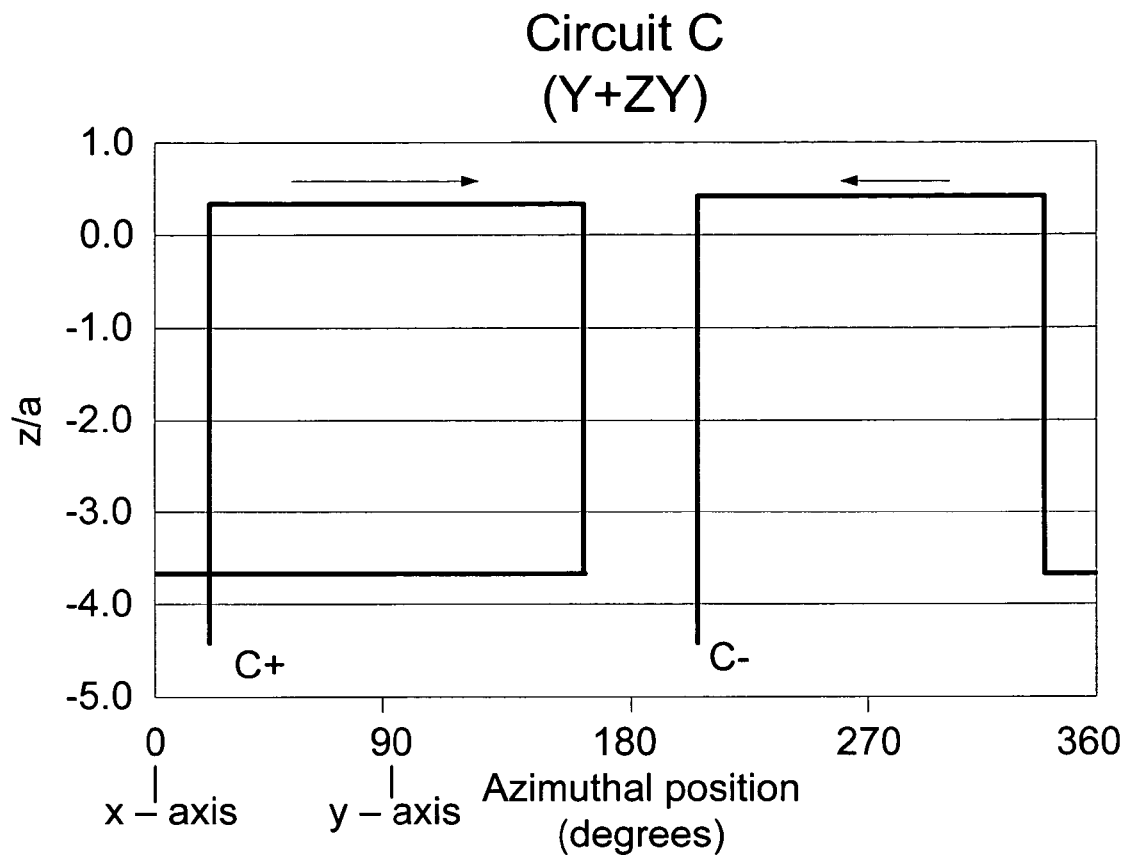
FIG. 11 is a cylindrical coordinate system graph, illustrating the location and configuration of a "Y+ZY" shim of the present invention used in place of the prior art.
Figure 11:
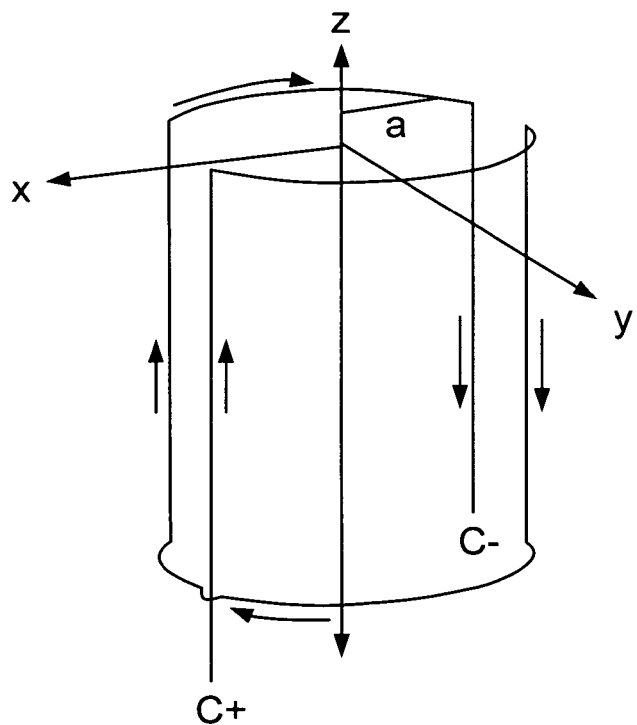

FIG. 11 shows Circuit C, which replaces the prior art Y shim. It includes one complete loop around the +y axis. Current within this loop (again viewed from the perspective of the azimuthal plot) flows in a clockwise direction.

Figure 12:
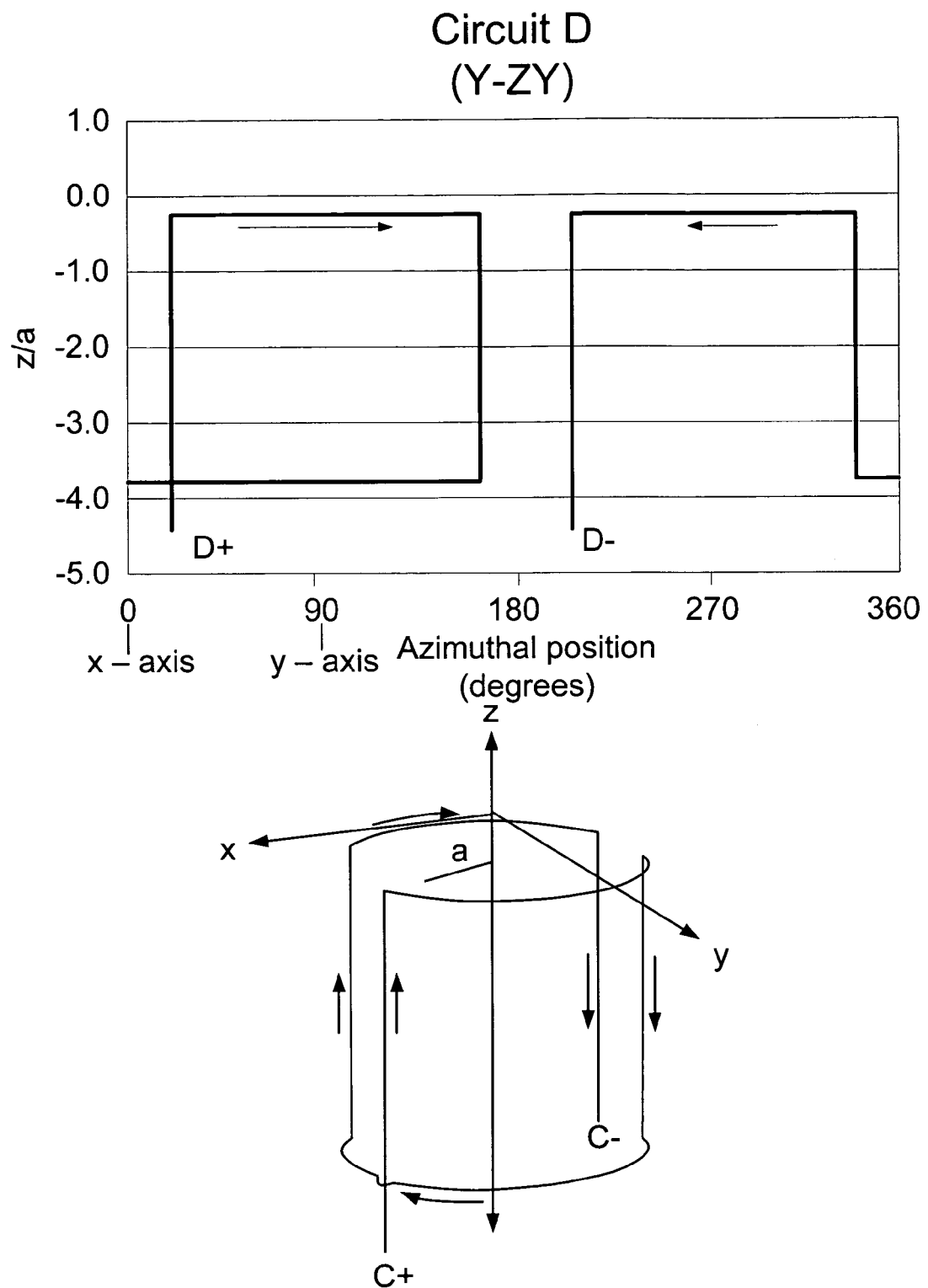
FIG. 12 is a cylindrical coordinate system graph, illustrating the location and configuration of a "Y–ZY" shim of the present invention used in place of the prior art.
Figure 13:
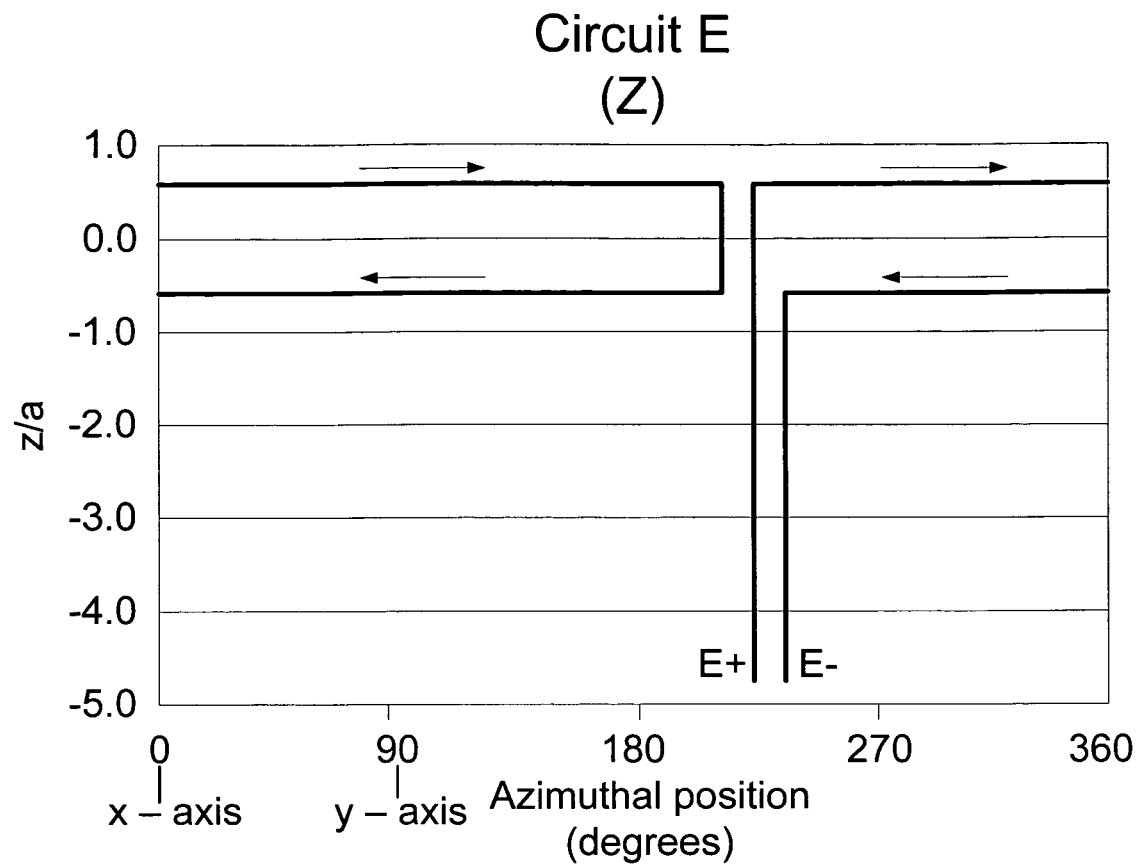
FIG. 13 a cylindrical coordinate system graph, illustrating the location and configuration of a "Z" shim of the present invention used in place of the prior art Z shim.
Figure 13:
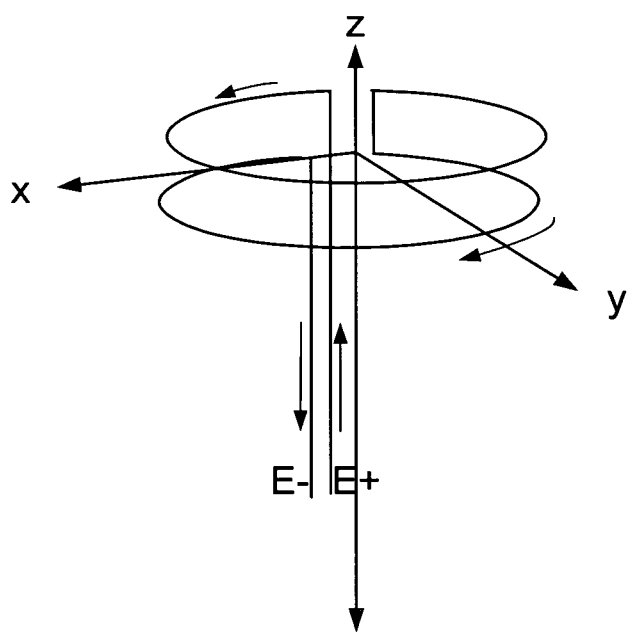

FIG. 12 illustrates Circuit D, which replaces the prior art ZY shim. Circuit D follows the same path as Circuit C, except that it is translated in the −z direction. Current within this circuit's loop flows in a clockwise direction. The inlet lines for Circuits C and D (C+ and D+) are slightly offset so that they do not overlay. The outlet lines are likewise offset. Circuit C replaces the inboard, above-midplane turns of the Y and ZY shims of the prior art. Circuit D replaces the inboard, below-midplane turns of the Y and ZY shims of the prior art FIG. 13 illustrates the location and configuration of Circuit E which replaces the prior art Z shim. Two current loops are formed by Circuit E, with a first current loop lying on the +z side of the mid-plane and the second current loop lying on the −z side of the mid-plane.

Figure 14:
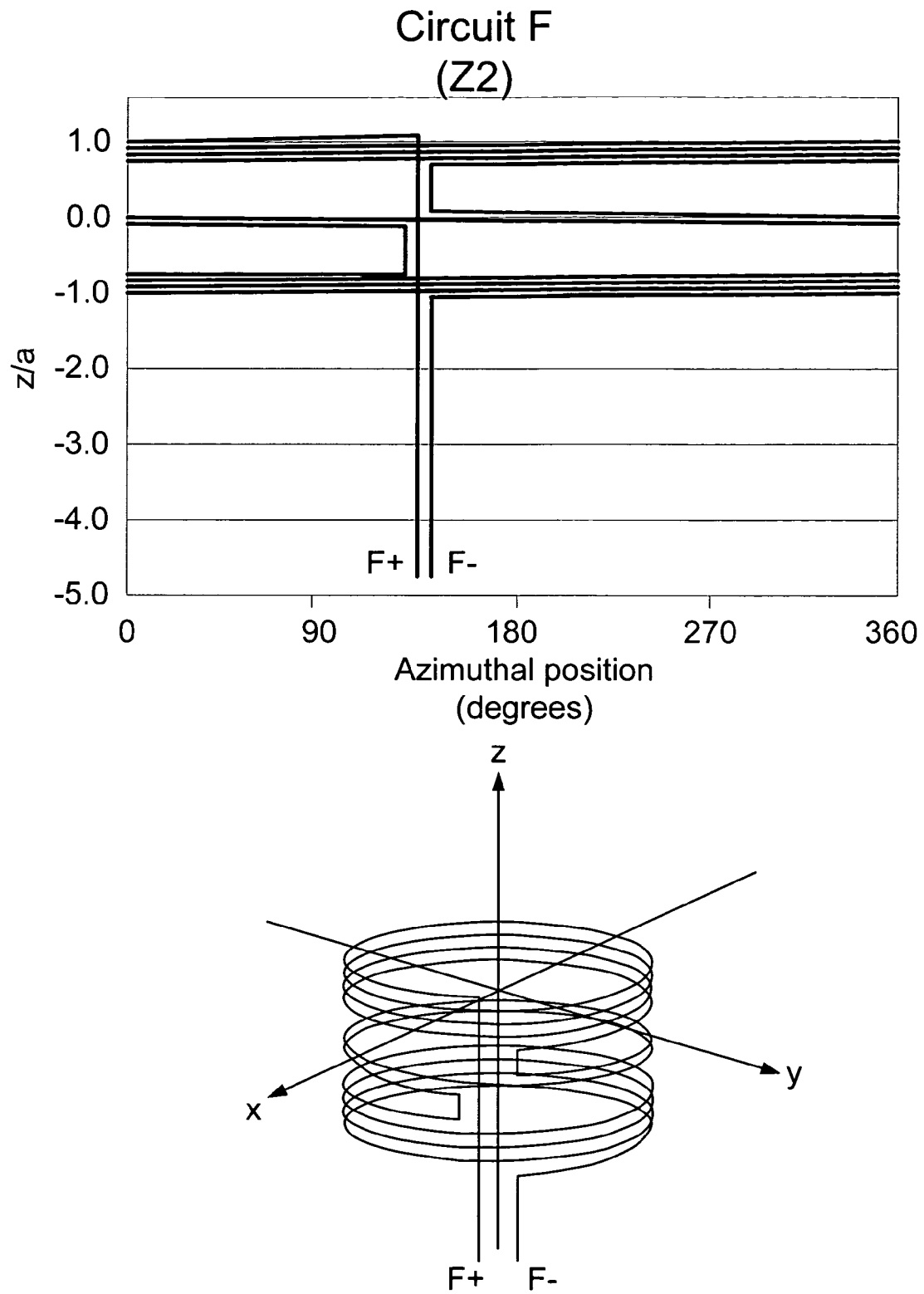
FIG. 14 a cylindrical coordinate system graph, illustrating the location and configuration of a "Z2" shim of the present invention used in place of the prior art Z2 shim.

FIG. 14 illustrates the location and configuration of Circuit F which replaces the prior art Z2 shim. Circuit F has three pluralities of loops. The first plurality lies on the +z side of the mid-plane, proximate the +1.0 z/a position. The second plurality lies proximate the mid-plane itself. The third plurality lies on the −z side of the mid-plane, proximate the −1.0 z/a position.

Representative design specifications for each of the shim circuits previously described is provided in TABLE ONE:

TABLE ONE

| Shim Circuit | Resistance (mΩ) | Current (A) | Voltage (V) |
|---|---|---|---|
| A | 1.80 | 139 | 0.25 |
| B | 1.66 | −38 | −0.063 |
| C | 1.68 | 144 | 0.241 |
| D | 1.54 | −59 | −0.092 |
| E | 1.46 | 105 | 0.153 |
| F | 4.41 | 108 | 0.478 |

The required current for each of the circuits is less than 150 A at less than one volt. Power supplies with this combination of current and voltage are commercially available. It is preferred that each shim circuit have its own power supply so that independent adjustments can be made.

The reader will note that, unlike the prior art configurations, the circuit configuration of the present invention never has more than 2 overlapping azimuthally directed turns at any z/a positional coordinate. And, the overlaps that do exist are orthogonal intersections rather than substantial lengths of overlaid portions. This substantially reduces the radial space required for shimming and provides many other benefits readily apparent to one that is skilled in the art.

Strength and purity analysis validates the effectiveness of the proposed circuit configuration. The strength of each of the shim terms has been analyzed as a function of shim turn geometry to validate that the shims are effective in producing sufficient corrective fields while both eliminating the outboard terms of the X, Y, ZX and ZY shims and maintaining sufficient purity of the corrective term.

Figure 1:
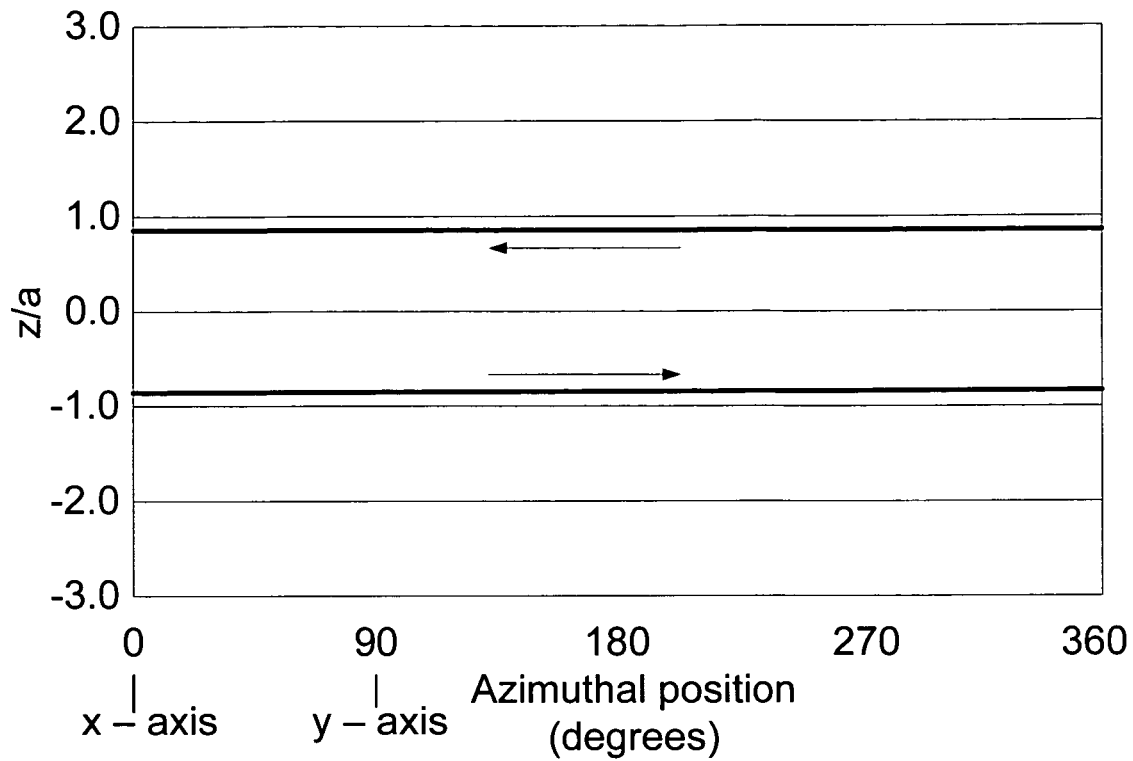
FIG. 1 is a cylindrical coordinate system graph, illustrating the location and configuration of prior art Z shims.
Figure 1:
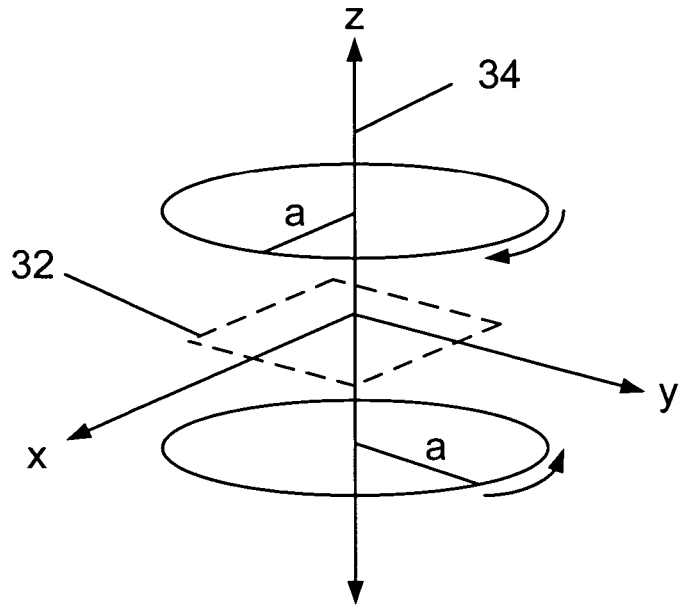
Figure 2:
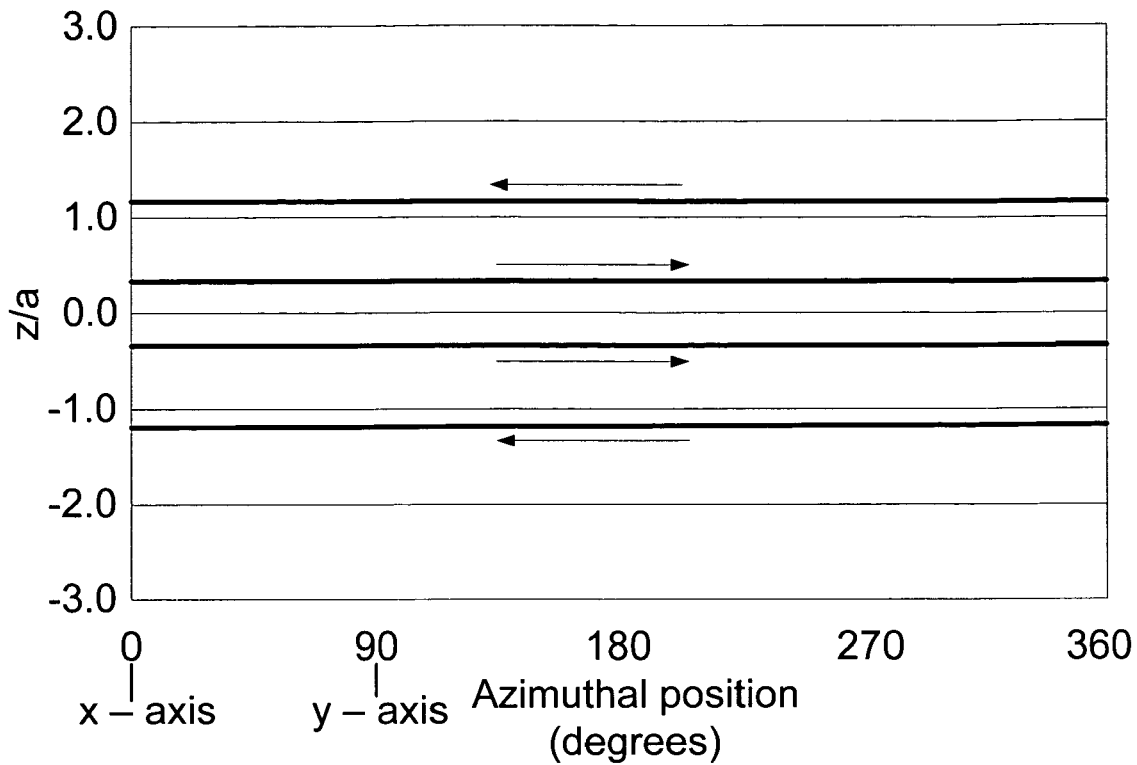
FIG. 2 is a cylindrical coordinate system graph, illustrating the location and configuration of prior art Z2 shims.
Figure 2:
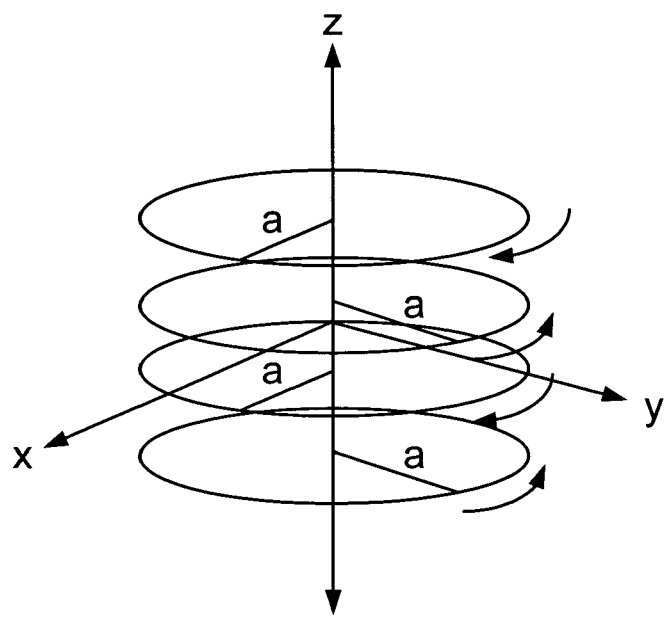
Figure 3:
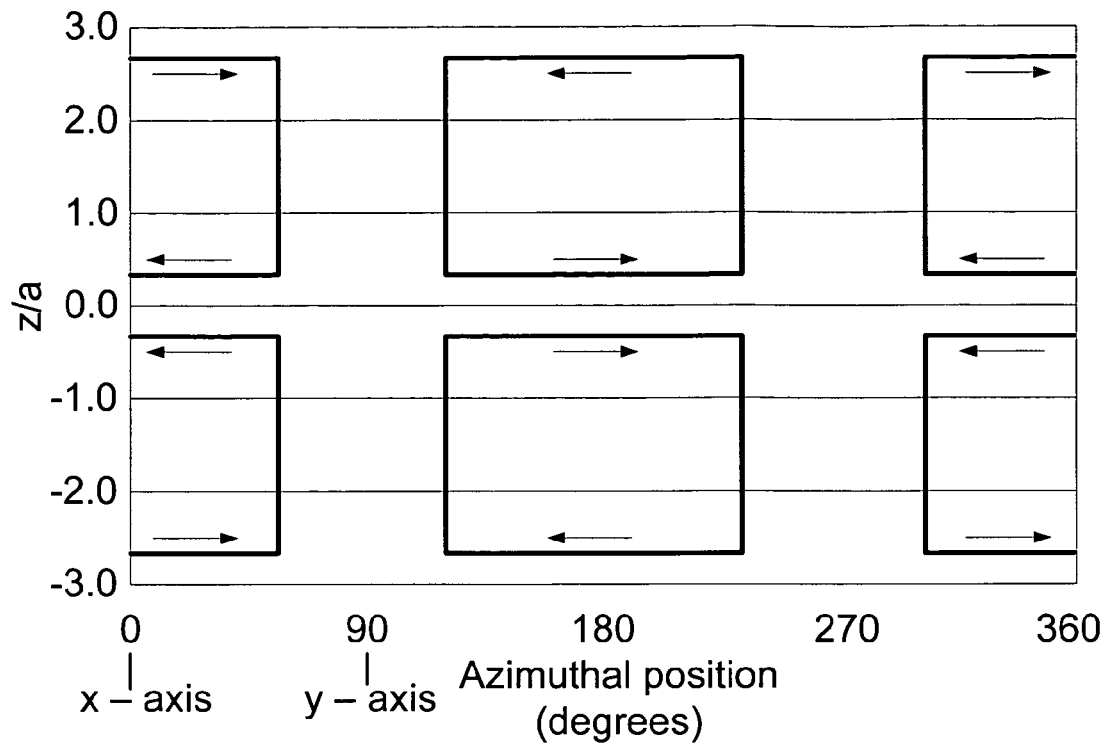
FIG. 3 is a cylindrical coordinate system graph, illustrating the location and configuration of prior art X shims.
Figure 3:
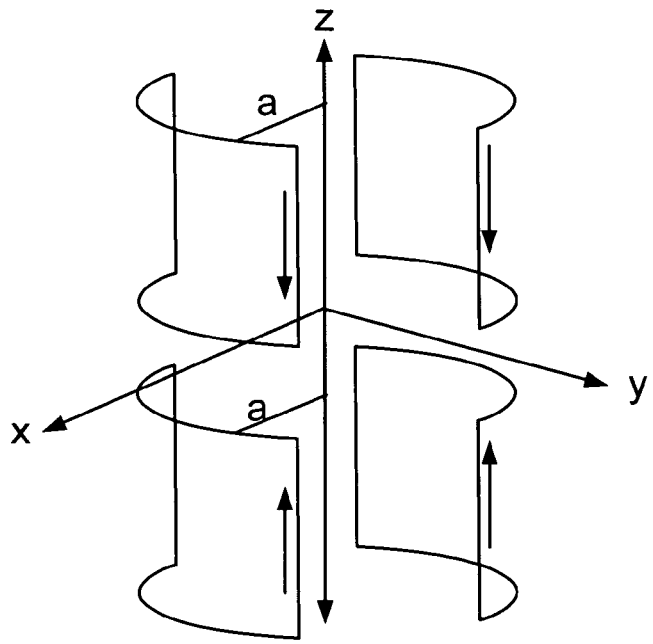
Figure 4:
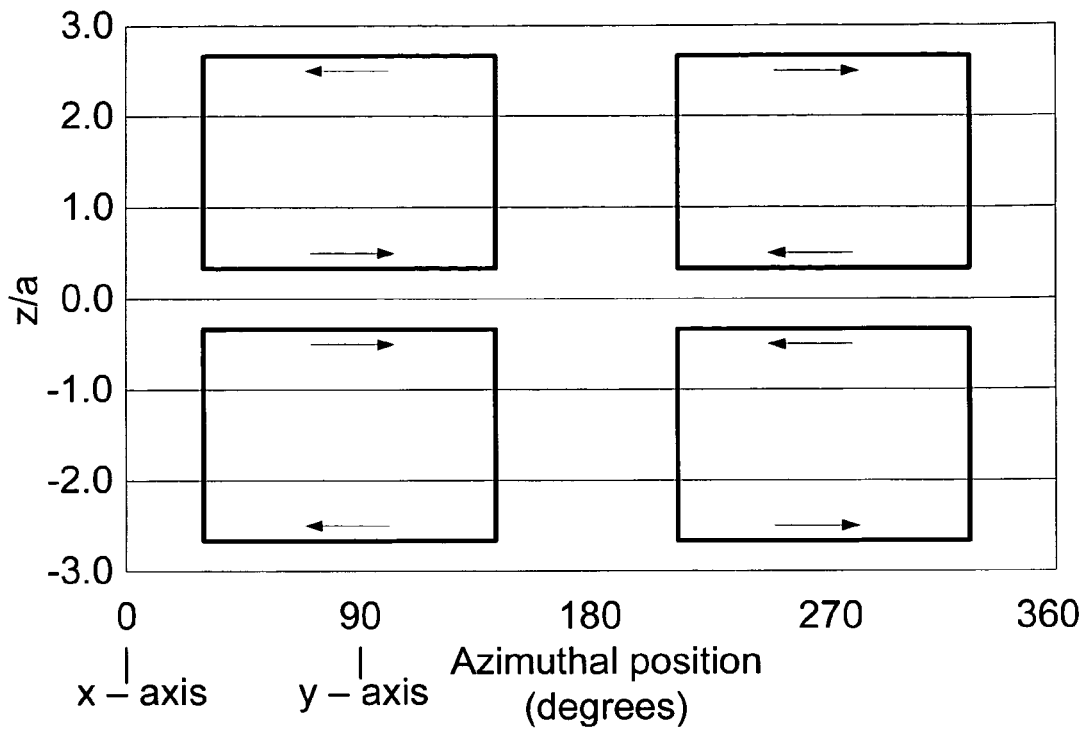
FIG. 4 is a cylindrical coordinate system graph, illustrating the location and configuration of prior art Y shims.
Figure 4:
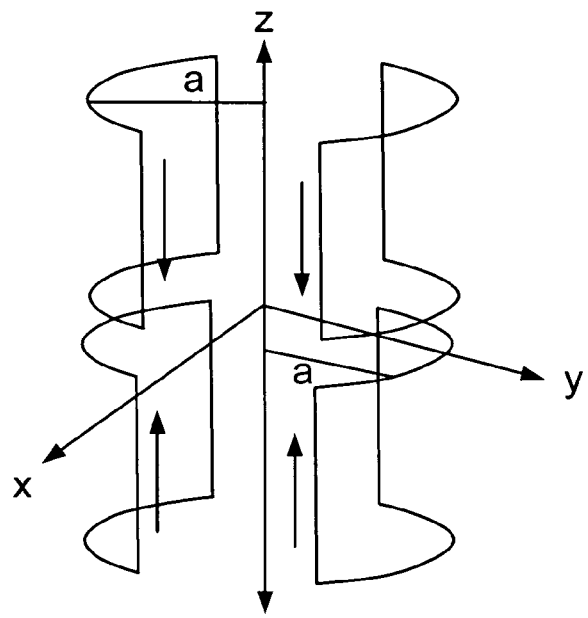
Figure 5:
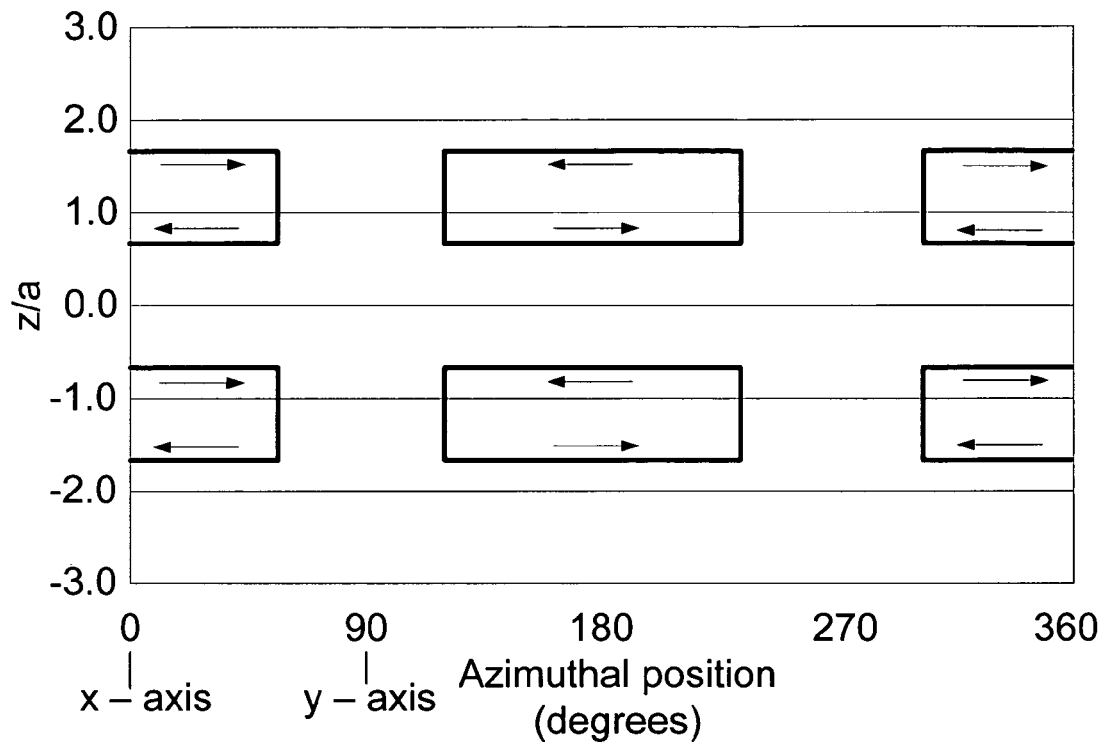
FIG. 5 is a cylindrical coordinate system graph, illustrating the location and configuration of prior art XZ shims.
Figure 5:
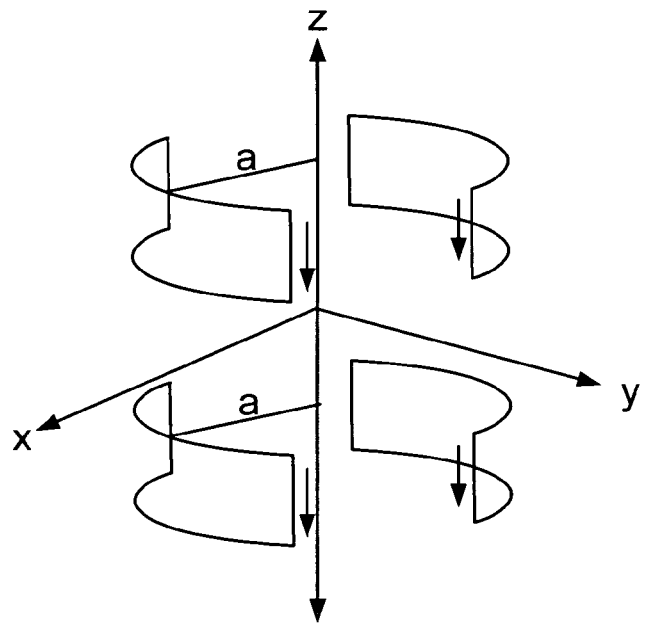
Figure 6:
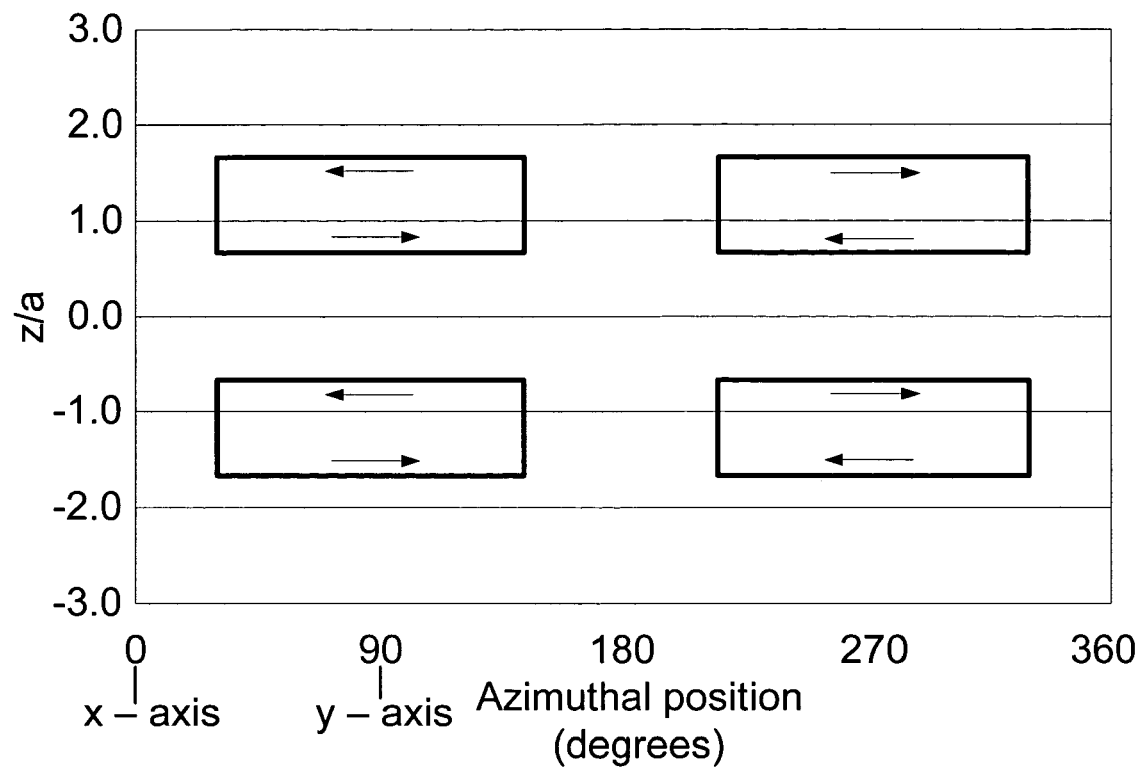
FIG. 6 is a cylindrical coordinate system graph, illustrating the location and configuration of prior art YZ shims.
Figure 6:
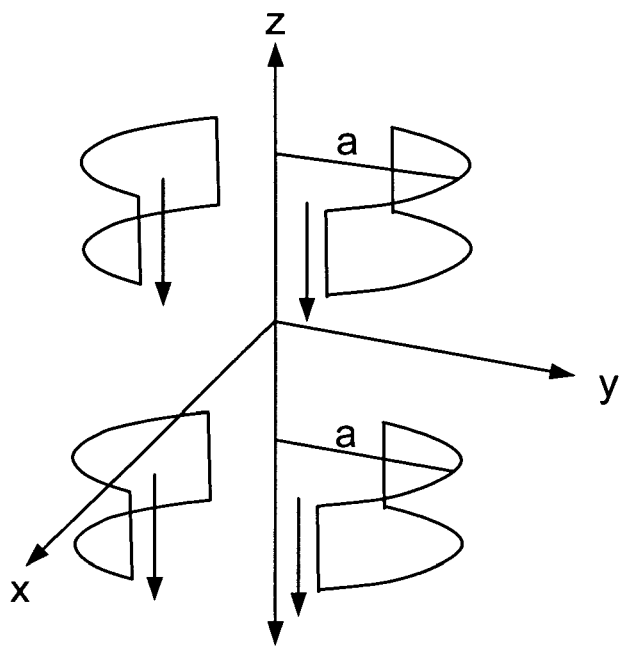
Figure 7:
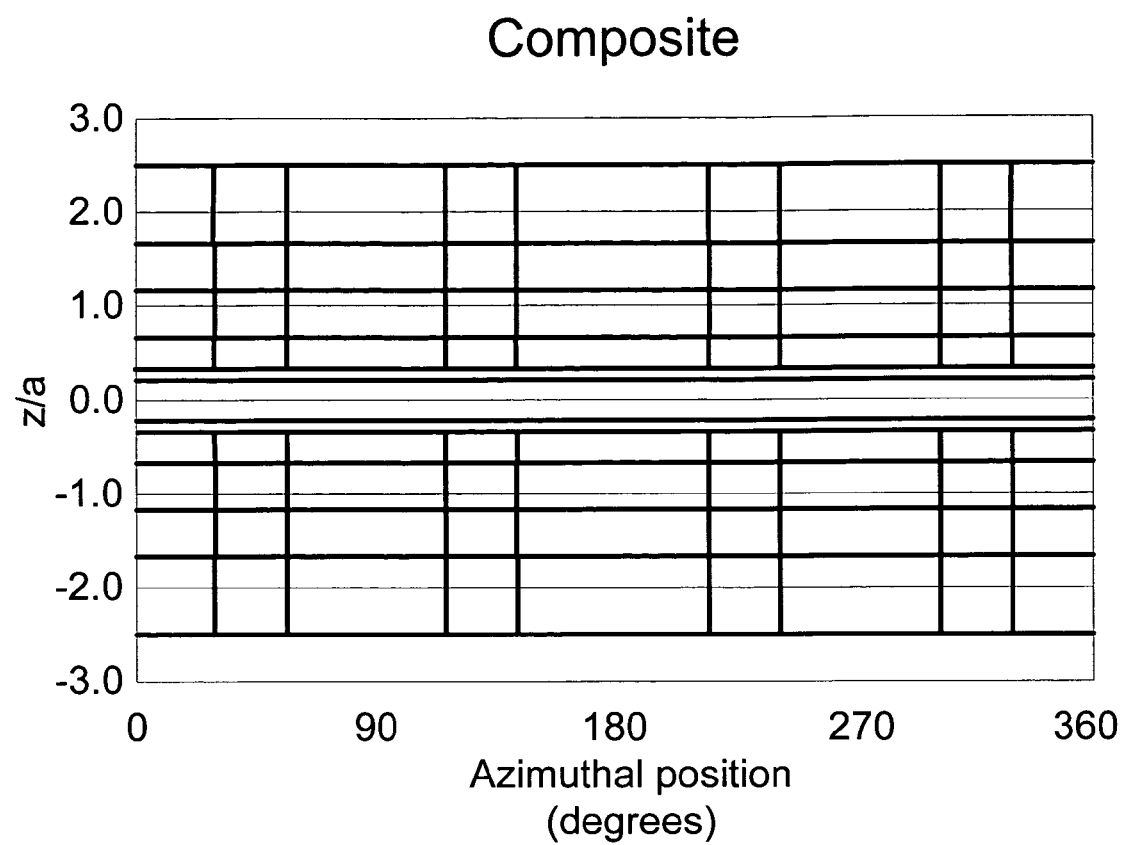
FIG. 7 is a cylindrical coordinate system graph, illustrating the composite location and configuration of prior art shims.
Figure 8:
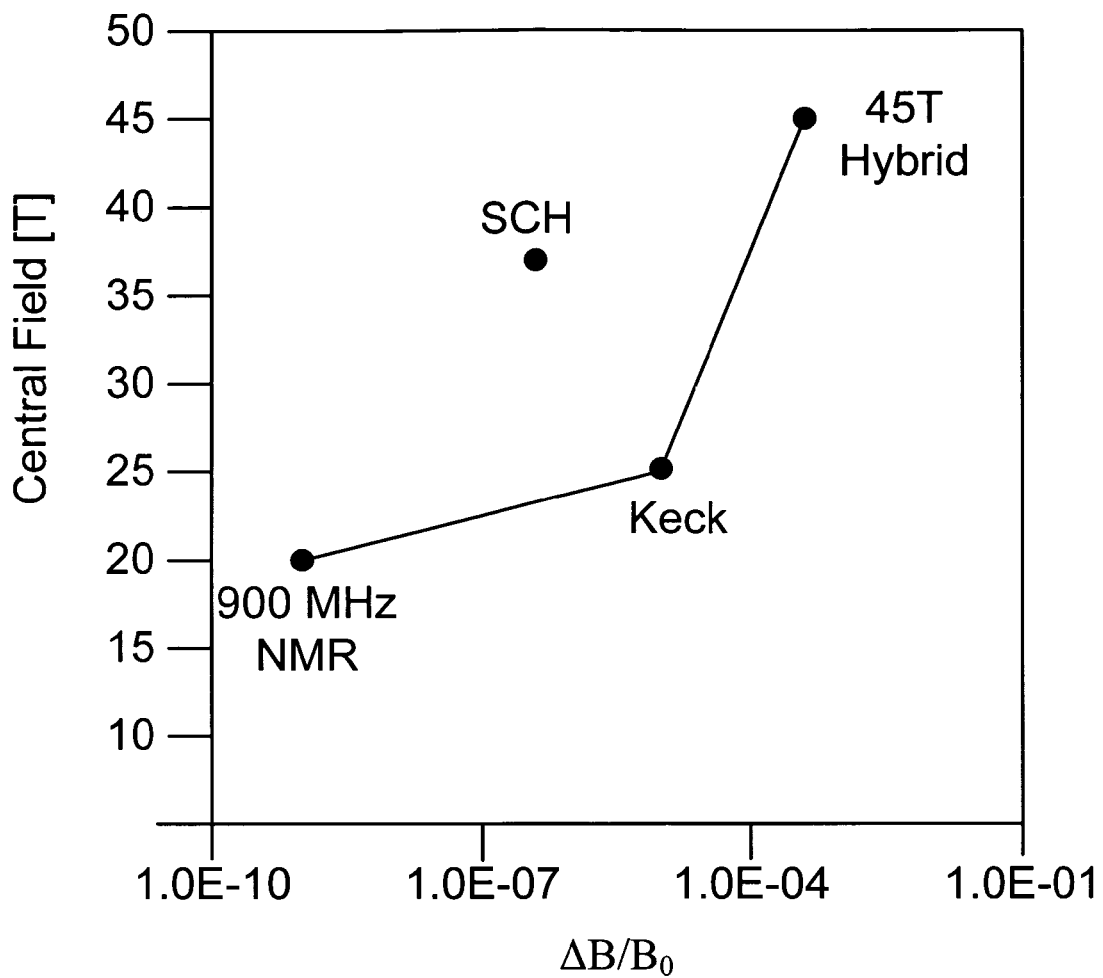
FIG. 8 is a graphical view, illustrating the performance of a resistive magnet employing the shimming configuration of the present invention compared to prior art high-homogeneity, high-field magnets.

FIG. 8 illustrates the improvement in field homogeneity provided by the present invention compared to the prior art. In this graph, field homogeneity and stability are evaluated with respect to a 1 cm diameter spherical volume. Field homogeneity is a unitless term created by dividing the variation in field strength by the total average field strength. A smaller number represents an improvement in field homogeneity.

As shown in the graph, a Series-Connected Hybrid (SCH) magnet system employing the present inventive shim configuration will produce a 36 T field having $10^{-6}$ field homogeneity and stability. This represents a dramatic improvement over the existing state of technology for high-homogeneity, high-field magnet systems. The technology boundary provided by existing systems is defined by the performance of a 45 T Hybrid located at the National High Magnetic Field Laboratory (NHMFL) at Florida State University which provides a field homogeneity of $10^{-4}$, the Keck magnet also located at the NHMFL which provides a field homogeneity of $10^{-5}$ at 25 T, and commercially-available 900 MHz NMR systems providing $10^{-9}$ homogeneity at 21 T.

Figure 15:
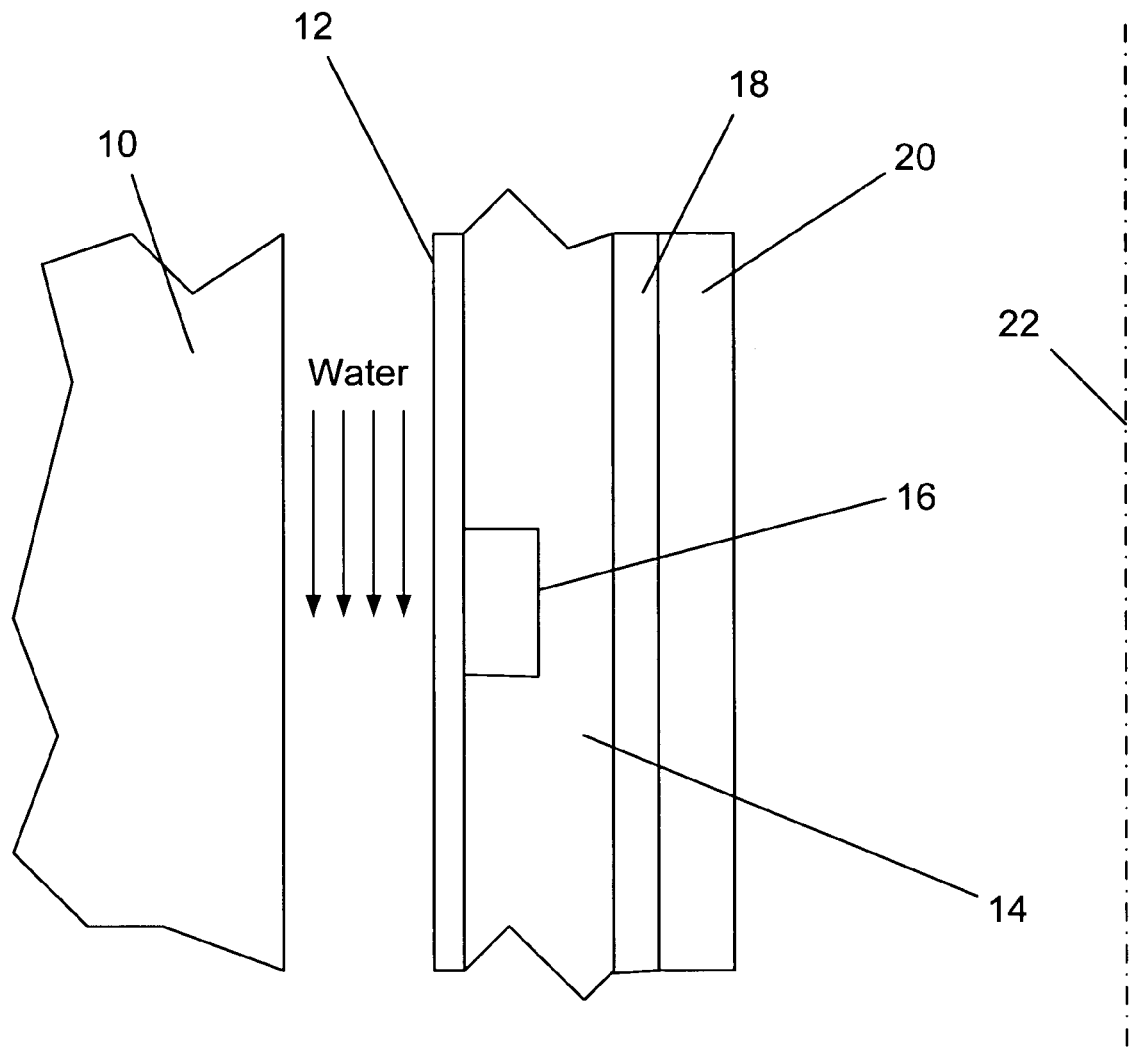
FIG. 15 is a partial radial section view, showing fabrication of a resistive shim using the present invention combined with cooling available at the inner diameter of a high-field resistive magnet.
Figure 16:
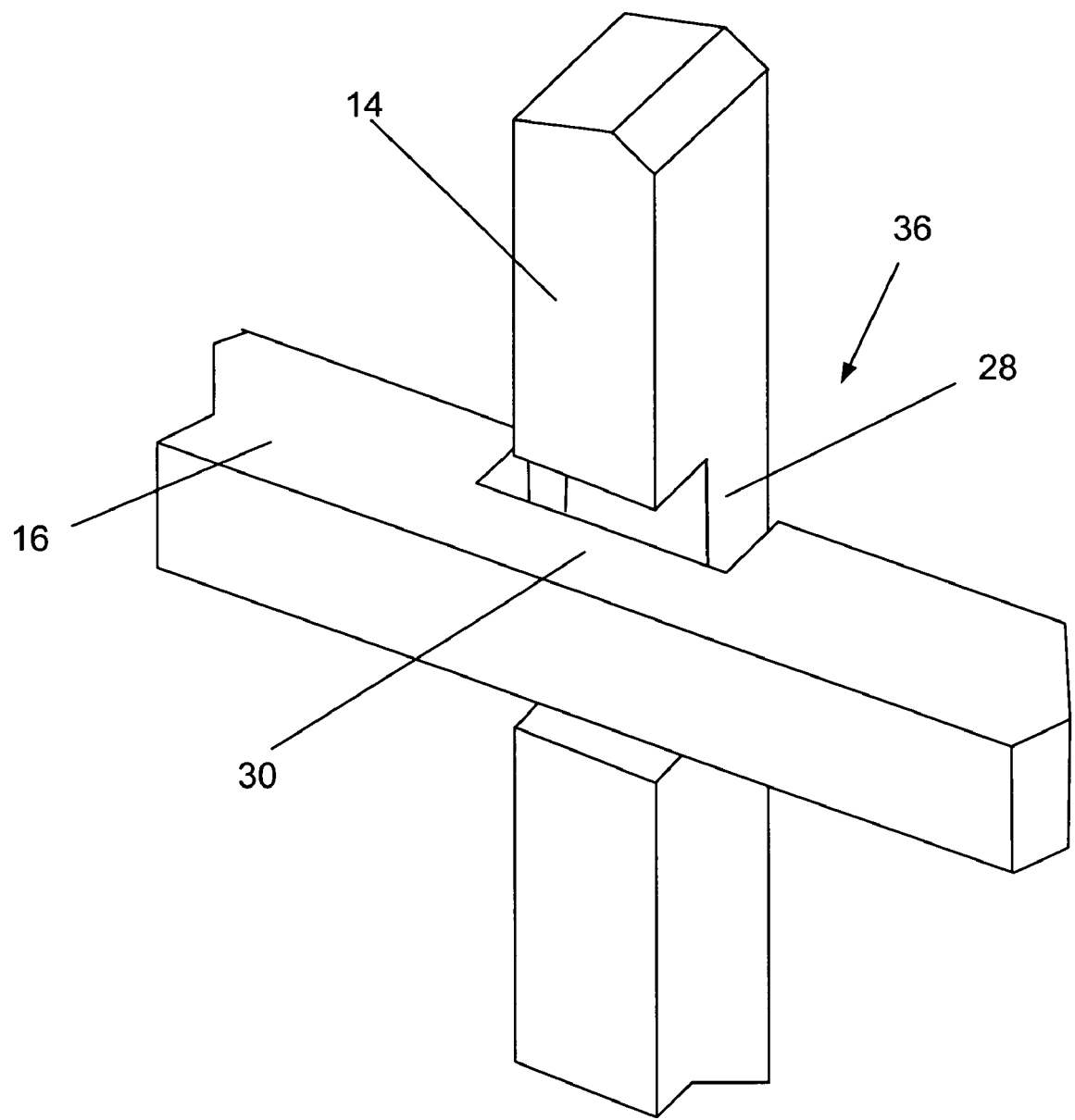
FIG. 16 is a perspective view, illustrating a crossover of conductors in the present invention.

FIG. 15 illustrates how the shim configuration of the present invention may be used in conjunction with a resistive magnet. FIG. 15 is a partial cross-sectional view of a magnet assembly taken along the radial direction. As shown in FIG. 15, the resistive shims are mounted directly into resistive-magnet bore tube 20 near the inner surface of resistive magnet 10. This allows the shims to be exposed to the cooling water which is normally supplied to that region. The shim conductors, illustrated as shim turn 14 and cross-over turn 16, have a 3 mm×3 mm square cross-section along the length of the turn. In the region of the crossover, both conductor cross-sections are reduced to 1.5 mm in the radial direction to allow the conductors to cross over each other without increasing the radial build requirements for the magnet. The cross-over is illustrated in greater detail in FIG. 16 in which shim turn 14 and cross-over turn 16 have reduced portions 30 and 28 in the region of overlap.

Figure 17:
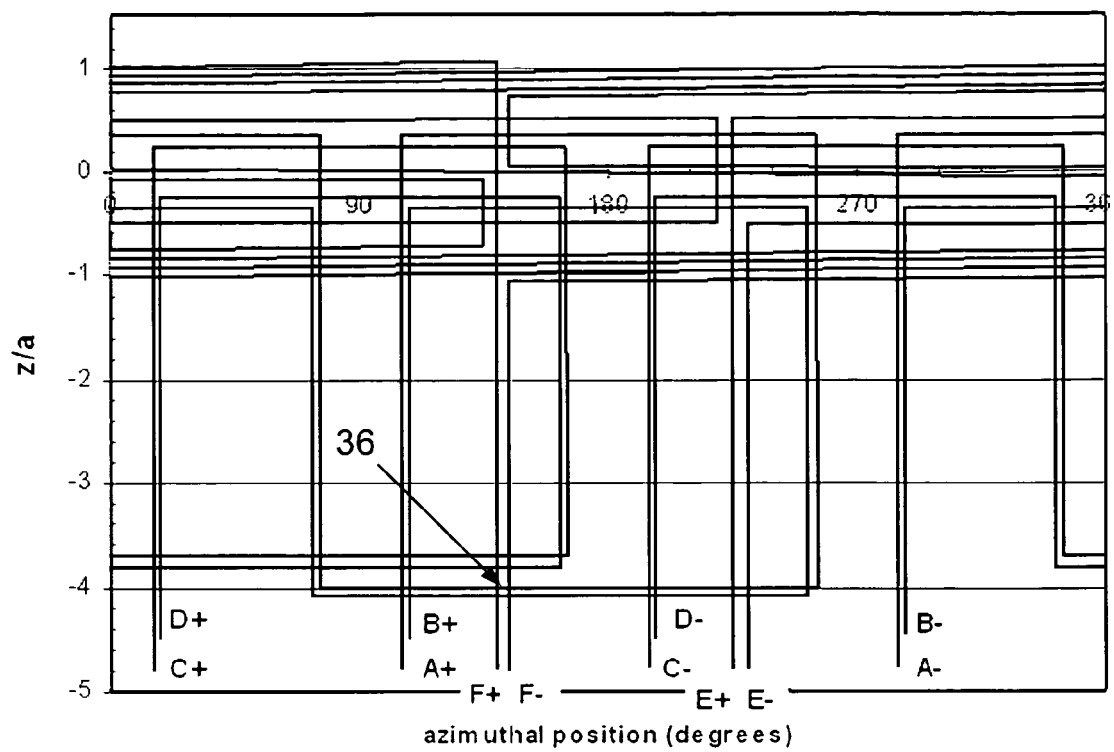
FIG. 17 is a cylindrical coordinate system graph, showing all the inventive shims overlaid.

FIG. 17 show all the present shims projected on an azimuthal plot. The reader will observe that the shim positions do not create substantial overlays where one portion of a current loop lies over a portion of another current loop. The circuits do intersect, but these intersections occur only at crossing points 36. Each of these crossing points assume the form shown in FIG. 16.

Turning back to FIG. 15, shim coil former 18 is mounted directly on bore tube 20. In the preferred embodiment, bore tube 20 is approximately 2 mm thick. Shim coil former 18 (a cylindrical object having open channels for receiving the shim coil conductors) is preferably manufactured from a G10-type fiberglass epoxy resin material or other suitable electrical insulator. 3.0 mm deep conductor paths are milled into the outer surface of shim coil former 18 along the previously described coordinates. After the 3.0 mm deep conductor paths are machined in the G10 tube, a continuous 0.5 mm base of G10 remains at the inner diameter to keep the shim coil former intact. Accordingly, the G10 material used for shim coil former 18 is preferably 3.5 mm thick. Once the conductor paths are machined into the G10 tube, the resistive shims are placed in the conductor paths. A total of 50.8 µm thickness of kapton insulation is preferably placed between the conductor turns at the crossing points. Electrical insulation overwrap 12 is then placed around the shims and shim coil former and holds the assembly together.

It should be noted that a Z0 coil may be added for flux stabilization. If such a coil is included, it would preferably be wound on top of the previously described shim circuits after a layer of epoxy-glass composite electrical insulation (such as electrical insulation overwrap 12) is applied. Outside the Z0 coil, a second layer of epoxy-glass composite insulation is applied. Thus, the Z0 coil is "sandwiched" between two layers of electrical insulation. Each layer of insulation is preferably a 0.2 mm thick epoxy-glass composite. The glass consists of a 0.1 mm thick fiberglass tape applied with a 50% overlap resulting in a total insulation build of 0.2 mm. The Z0 coil, wound from a layer of 4 mm×25.4 µm thick copper tape, is located between the two layers of electrical insulation.

The Z0 coil also serves as reinforcement to the shim conductor turns which can experience Lorentz loads conservatively estimated at 104 MPa in the Z0 coil conductor when the shim conductor carries 150 A in a 25 T background field. The design specifications for the Z0 coil are provided in TABLE TWO. The Z0 coil is preferably centered on the mid-plane and actively controlled by an active feedback loop monitoring the temporal magnetic field fluctuations in the high-field region.

TABLE TWO

Z0 Coil Design Specifications

| | |
|---|---|
| background field | 25 T |
| required strength | 2.50E–04 T |
| coil radius | 0.035224 m |
| conductor thickness | 0.0004 m |
| conductor width | 0.004 m |
| conductor cross-section | 1.6E–06 m$^2$ |
| coil length | 0.39 m |
| helical winding angle | 1.04 degrees |
| gap between turns | 0.00025 m |
| turns density | 235 turns/m |
| number of turns per layer | 91.7 |
| number of layers | 1 |
| solenoid strength | 2.91 E–04 T/A |
| required current | 8.60 A |
| active conductor length | 20.29 m |
| copper resistivity | 1.93E–08 ohm-m |
| copper conductor resistance | 0.245 ohm |
| current density | 5.38 A/mm$^2$ |
| inductance | 98.7 µH |
| minimum yiels stress in conductor | 240 MPa |

Thermal analysis validates the feasibility of such a configuration in a resistive magnet. The thermal resistance between the heating in the shim conductors and the cooling at the inner diameter of the resistive magnet is sufficiently low to maintain a maximum temperature in the shim conductor to acceptable operational levels.

The preceding description contains significant detail regarding the novel aspects of the present invention. It should not be construed, however, as limiting the scope of the invention but rather as providing illustrations of the preferred embodiments of the invention.

What is claimed is:

1. A shim assembly for improving magnetic field uniformity in an electromagnet having a central axis, a central bore which is aligned with said central axis and which is bounded by a cylindrical wall, a mid-plane which is orthogonal to said central axis, a z-axis lying along said central axis, an x-axis lying in said mid-plane and orthogonal to said z-axis, and a y-axis lying in said mid-plane and orthogonal to said z-axis and said x-axis, said shim assembly comprising:

a. an A circuit having an A circuit loop which surrounds the −x axis;
  b. wherein the majority of said A circuit loop lies on the −z side of said mid-plane;
  c. a B circuit having a B circuit loop which surrounds the −x axis;
  d. wherein all of said B circuit loop lies on said −z side of said mid-plane;
  e. a C circuit having a C circuit loop which surrounds said y axis;
  f. wherein the majority of said C circuit loop lies on the −z side of said mid-plane;
  g. a D circuit having a D circuit loop which follows the same path as said C circuit, except that said D circuit is translated in the −z direction with respect to said C circuit so that all of said D circuit lies on the −z side of said mid-plane;
  h. an E circuit having a first E circuit loop and a second E circuit loop, wherein said first E circuit loop surrounds the +z-axis and said second E circuit loop surrounds the −z-axis;
  i. wherein said first E circuit loop lies on the +z side of said mid-plane and said second E circuit loop lies on said −z side of said mid-plane;
  j. an F circuit having a first plurality of F circuit loops, a second plurality of F circuit loops, and a third plurality of F circuit loops; and
  k. wherein said first plurality of F circuit loops lies on said +z side of said mid-plane, said second plurality of F circuit loops lies proximate said mid-plane, and said third plurality of F circuit loops lies on said −z side of said mid-plane.

2. A shim assembly as recited in claim 1, wherein said A circuit loop, said B circuit loop, said C circuit loop, said D circuit loop, said E circuit loop, said first plurality of F circuit loops, said second plurality of F circuit loops, and said third plurality of F circuit loops are all located proximate said cylindrical wall bounding said central bore, with said circuit loops lying on a side of said cylindrical wall which is opposite said central axis.

3. A shim assembly as recited in claim 1, further comprising a Z0 shim coil.

4. A shim assembly as recited in claim 1, wherein:
  a. the electrical current in said A circuit loop flows in a clockwise direction when viewed on an azimuthal plot;
  b. the electrical current in said B circuit loop flows in a clockwise direction when viewed on an azimuthal plot;
  c. the electrical current in said C circuit loop flows in a clockwise direction when viewed on an azimuthal plot;
  d. the electrical current in said D circuit loop flows in a clockwise direction when viewed on an azimuthal plot;
  e. the electrical current in said first E circuit loop flows in the direction of the x-axis cross the y-axis;

f. the electrical current in said second E circuit loop flows in the direction of the y-axis cross the x-axis;

g. the electrical current in said first plurality of F circuit loops flows in the direction of the y-axis cross the x-axis;

h. the electrical current in said second plurality of F circuit loops flows in the direction of the x-axis cross the y-axis; and i. the electrical current in said third plurality of F circuit loops flows in the direction of the y-axis cross the x-axis.

5. A shim assembly as recited in claim 4, wherein said A circuit loop, said B circuit loop, said C circuit loop, said D circuit loop, said E circuit loop, said first plurality of F circuit loops, said second plurality of F circuit loops, and said third plurality of F circuit loops are all located proximate said cylindrical wall bounding said central bore, with said circuit loops lying on a side of said cylindrical wall which is opposite said central axis.

6. A shim assembly as recited in claim 4, wherein:
   a. each of said current loops is located proximate said cylindrical wall bounding said central bore, with said current loops lying on a side of said cylindrical wall which is opposite said central axis;
   b. each of said current loops is located a distance "a" from said central axis;
   c. each point in each of said current loops can be defined by a ratio of its position along said z-axis divided by its distance "a" from said central axis, with said ratio being known as "z/a ratio", and its azimuthal position in degrees from said x-axis;
   d. said A circuit loop lies
      i. between a z/a ratio of about +0.4 and a z/a ratio of about −4.0,
      ii. between an azimuthal position of about 90 degrees and about 270 degrees;
   e. said B circuit loop lies
      i. between a z/a ratio of about −0.2 and a z/a ratio of about −4.2,
      ii. between an azimuthal position of about 90 degrees and about 270 degrees;
   f. said C circuit loop lies
      i. between a z/a ratio of about +0.4 and a z/a ratio of about −3.8,
      ii. between an azimuthal position of about 0 degrees and about 180 degrees;
   g. said D circuit loop lies
      i. between a z/a ratio of about −0.2 and a z/a ratio of about −4.0,
      ii. between an azimuthal position of about 0 degrees and about 180 degrees;
   h. said E circuit loop lies between a z/a ratio of about +0.6 and a z/a ratio of about −0.6;
   i. said first plurality of F circuit loops lies between a z/a ratio of about +1.2 and a z/a ratio of about +0.6;
   j. said second plurality of F circuit loops lies proximate a z/a ratio of 0.0; and
   k. said third plurality of F circuit loops lies between a z/a ratio of −0.6 and −1.2.

7. A shim assembly as recited in claim 6 wherein said A circuit loop, said B circuit loop, said C circuit loop, said D circuit loop, said E circuit loop, said first plurality of F circuit loops, said second plurality of F circuit loops, and said third plurality of F circuit loops intersect only at a plurality of crossing points.

8. A shim assembly as recited in claim 6, further comprising a Z0 shim coil.

9. A shim assembly as recited in claim 6, wherein said A circuit loop, said B circuit loop, said C circuit loop, said D circuit loop, said E circuit loop, said first plurality of F circuit loops, said second plurality of F circuit loops, and said third plurality of F circuit loops are all located proximate said cylindrical wall bounding said central bore, with said circuit loops lying on a side of said cylindrical wall which is opposite said central axis.

10. A shim assembly as recited in claim 9 wherein said A circuit loop, said B circuit loop, said C circuit loop, said D circuit loop, said E circuit loop, said first plurality of F circuit loops, said second plurality of F circuit loops, and said third plurality of F circuit loops intersect only at a plurality of crossing points.

11. A shim assembly for improving magnetic field uniformity in an electromagnet having a central axis, a central bore which is aligned with said central axis and which is bounded by a cylindrical wall, a mid-plane which is orthogonal to said central axis, a z axis lying along said central axis, an x-axis lying in said mid-plane and orthogonal to said z-axis, and a y-axis lying in said mid-plane and orthogonal to said z-axis and said x-axis, said shim assembly comprising:
   a. an X+ZX shim;
   b. an X−ZX shim;
   c. a Y+ZY shim;
   d. a Y−ZY shim;
   e. a Z shim; and
   f. a Z2 shim.

12. A shim assembly as recited in claim 11 wherein said X+ZX shim, said X−ZX shim, said Y+ZY shim, said Y−ZY shim, said Z shim, and said Z2 shim intersect only at a plurality of crossing points.

13. A shim assembly as recited in claim 11, further comprising a Z0 shim coil.

14. A shim assembly as recited in claim 11, wherein said X+ZX, X−ZX shim, said Y+ZY shim, said Y−ZY shim, said Z shim, and said Z2 shim are all located proximate said cylindrical wall bounding said central bore, with said shims lying on a side of said cylindrical wall which is opposite said central axis.

15. A shim assembly as recited in claim 14 wherein said X+ZX shim, said X−ZX shim, said Y+ZY shim, said Y−ZY shim, said Z shim, and said Z2 shim intersect only at a plurality of crossing points.

16. A shim assembly as recited in claim 14, wherein:
   a. each of said shims contains a current loop located proximate said cylindrical wall bounding said central bore, with said current loops lying on a side of said cylindrical wall which is opposite said central axis;
   b. each of said current loops is located a distance "a" from said central axis;
   c. each point in each of said current loops can be defined by a ratio of its position along said z-axis divided by its distance "a" from said central axis, with said ratio being known as "z/a ratio", and its azimuthal position in degrees from said x-axis;
   d. said X+ZX shim contains a current loop lying
      i. between a z/a ratio of about +0.4 and a z/a ratio of about −4.0,
      ii. between an azimuthal position of about 90 degrees and about 270 degrees;
   e. said X−ZX shim contains a current loop lying
      i. between a z/a ratio of about −0.2 and a z/a ratio of about −4.2,
      ii. between an azimuthal position of about 90 degrees and about 270 degrees;

f. said Y+ZY shim contains a circuit loop lying
   i. between a z/a ratio of about +0.4 and a z/a ratio of about −3.8,
   ii. between an azimuthal position of about 0 degrees and about 180 degrees;
g. said Y−ZY shim contains a circuit loop lying
   i. between a z/a ratio of about −0.2 and a z/a ratio of about −4.0,
   ii. between an azimuthal position of about 0 degrees and about 180 degrees;
h. said Z shim contains a circuit loop lying between a z/a ratio of about +0.6 and a z/a ratio of about −0.6;
i. said Z2 shim contains a first plurality of circuit loops lying between a z/a ratio of about +1.2 and a z/a ratio of about +0.6;
j. said Z2 shim contains a second plurality of circuit loops lying proximate a z/a ratio of 0.0; and
k. said Z2 shim contains a third plurality of circuit loops lying between a z/a ratio of −0.6 and −1.2.

17. A shim assembly as recited in claim 16 wherein said X+ZX shim, said X−ZX shim, said Y+ZY shim, said Y−ZY shim, said Z shim, and said Z2 shim intersect only at a plurality of crossing points.

18. A shim assembly as recited in claim 16, further comprising a Z0 shim coil.

19. A shim assembly as recited in claim 16, wherein said X+ZX shim, said X−ZX shim, said Y+ZY shim, said Y−ZY shim, said Z shim, and said Z2 shim are all located proximate said cylindrical wall bounding said central bore, with said shims lying on a side of said cylindrical wall which is opposite said central axis.

20. A shim assembly as recited in claim 19 wherein said X+ZX shim, said X−ZX shim, said Y+ZY shim, said Y−ZY shim, said Z shim, and said Z2 shim intersect only at a plurality of crossing points.

* * * * *